(12) United States Patent
Lin et al.

(10) Patent No.: US 9,875,973 B2
(45) Date of Patent: Jan. 23, 2018

(54) SEMICONDUCTOR DEVICE AND METHOD FOR FORMING SEMICONDUCTOR PACKAGE HAVING BUILD-UP INTERCONNECT STRUCTURE OVER SEMICONDUCTOR DIE WITH DIFFERENT CTE INSULATING LAYERS

(71) Applicant: STATS ChipPAC, Ltd., Singapore (SG)

(72) Inventors: Yaojian Lin, Singapore (SG); Kang Chen, Singapore (SG); Yu Gu, Singapore (SG); Wei Meng, Singapore (SG); Chee Siang Ong, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 491 days.

(21) Appl. No.: 13/874,150

(22) Filed: Apr. 30, 2013

(65) Prior Publication Data
US 2013/0241048 A1    Sep. 19, 2013

Related U.S. Application Data

(63) Continuation of application No. 13/164,015, filed on Jun. 20, 2011, now Pat. No. 8,492,203.
(Continued)

(51) Int. Cl.
*H01L 21/56* (2006.01)
*H01L 23/00* (2006.01)
(Continued)

(52) U.S. Cl.
CPC ............ *H01L 23/562* (2013.01); *H01L 21/56* (2013.01); *H01L 21/561* (2013.01);
(Continued)

(58) Field of Classification Search
CPC . H01L 23/28; H01L 23/3107; H01L 23/3121; H01L 23/3128; H01L 23/49816;
(Continued)

(56) References Cited

U.S. PATENT DOCUMENTS 6,066,574 A    5/2000 You et al.
6,329,610 B1   12/2001 Takubo et al.
(Continued)

FOREIGN PATENT DOCUMENTS

TW              503496 B    9/2002

OTHER PUBLICATIONS

"Processing Procedures for Dry-Etch Cyclotene Advanced Electronic Resins (Dry-Etch BCB)". Published Nov. 1997; Dow Chemical Company.
(Continued)

*Primary Examiner* — Matthew Landau
*Assistant Examiner* — Dmitriy Yemelyanov
(74) *Attorney, Agent, or Firm* — Robert D. Atkins; Patent Law Group: Atkins and Associates, P.C.

(57) ABSTRACT

A semiconductor device has a semiconductor die and encapsulant deposited over the semiconductor die. A first insulating layer is formed over the die and encapsulant. The first insulating layer is cured with multiple dwell cycles to enhance adhesion to the die and encapsulant. A first conductive layer is formed over the first insulating layer. A second insulating layer is formed over the first insulating layer and first conductive layer. The second insulating layer is cured with multiple dwell cycles to enhance adhesion to the first insulating layer and first conductive layer. A second conductive layer is formed over the second insulating layer and first conductive layer. A third insulating layer is formed over the second insulating layer and second conductive layer. The first, second, and third insulating layers have
(Continued)

different CTE. The second insulating layer or third insulating layer is cured to a dense state to block moisture.

17 Claims, 10 Drawing Sheets

Related U.S. Application Data

(60) Provisional application No. 61/435,215, filed on Jan. 21, 2011.

(51) Int. Cl.
*H01L 23/31* (2006.01)
*H01L 23/498* (2006.01)
*H01L 23/538* (2006.01)
*H01L 23/29* (2006.01)

(52) U.S. Cl.
CPC ............ *H01L 21/565* (2013.01); *H01L 23/29* (2013.01); *H01L 23/3107* (2013.01); *H01L 23/3121* (2013.01); *H01L 23/3128* (2013.01); *H01L 23/49816* (2013.01); *H01L 23/5389* (2013.01); *H01L 24/19* (2013.01); *H01L 24/96* (2013.01); *H01L 21/568* (2013.01); *H01L 2224/12105* (2013.01); *H01L 2924/01029* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/181* (2013.01); *H01L 2924/18162* (2013.01); *H01L 2924/3511* (2013.01)

(58) Field of Classification Search
CPC . H01L 21/561; H01L 21/565; H01L 23/5389; H01L 24/19; H01L 21/56; H01L 23/562; H01L 23/29; H01L 24/96
USPC .................. 257/788–793, E21.502, E23.116, 257/E33.059, 758, 747, 748, 735–737; 438/6–127, 758–794, 612, 613
See application file for complete search history.

(56) References Cited

U.S. PATENT DOCUMENTS

| | | | |
|---|---|---|---|
| 6,727,576 B2 * | 4/2004 | Hedler et al. | 257/678 |
| 6,905,914 B1 * | 6/2005 | Huemoeller et al. | 438/118 |
| 2002/0000658 A1 | 1/2002 | Kuwabara et al. | |
| 2002/0173133 A1 | 11/2002 | Towle et al. | |
| 2003/0122246 A1 | 7/2003 | Lin et al. | |
| 2006/0183269 A1 | 8/2006 | Fuergut et al. | |
| 2007/0181995 A1 | 8/2007 | Hsu et al. | |
| 2007/0194412 A1 * | 8/2007 | Nakagawa et al. | 257/633 |
| 2008/0237836 A1 | 10/2008 | Chia et al. | |
| 2008/0318413 A1 | 12/2008 | Fillion et al. | |
| 2009/0140442 A1 | 6/2009 | Lin | |
| 2009/0152715 A1 | 6/2009 | Shim et al. | |
| 2009/0170241 A1 | 7/2009 | Shim et al. | |
| 2010/0006331 A1 | 1/2010 | Hsu | |
| 2010/0120204 A1 | 5/2010 | Kunimoto | |
| 2011/0104886 A1 | 5/2011 | Oi et al. | |

OTHER PUBLICATIONS

"Cyclotene 4000 Series Advanced Electronic Resins (Photo BCB)" Published Mar. 2009; Dow Chemical Company.

* cited by examiner

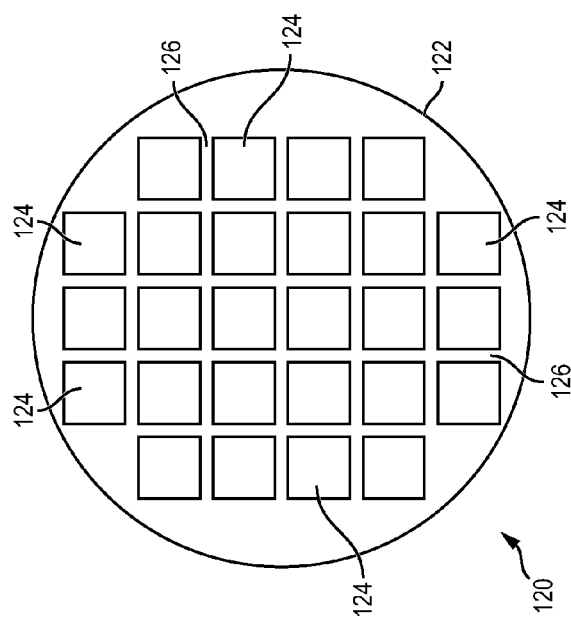
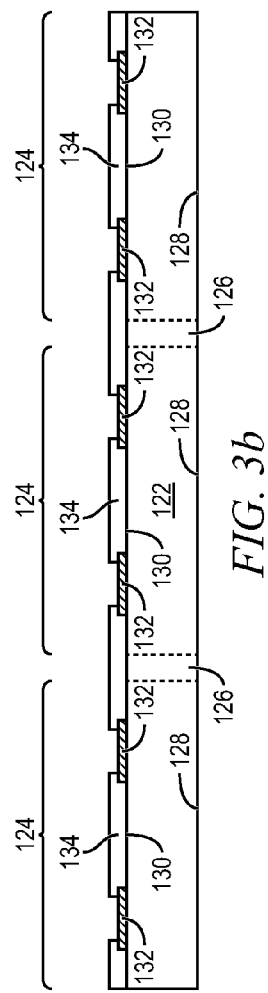

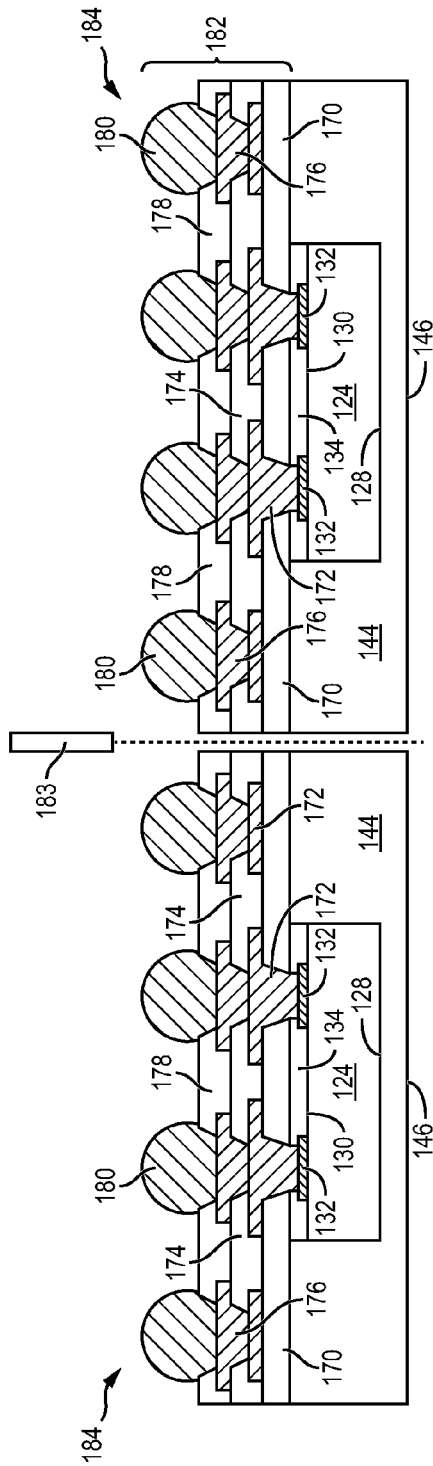
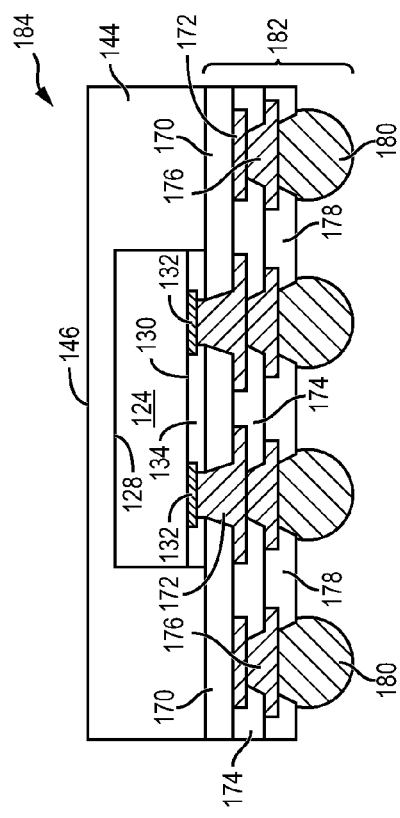

SEMICONDUCTOR DEVICE AND METHOD FOR FORMING SEMICONDUCTOR PACKAGE HAVING BUILD-UP INTERCONNECT STRUCTURE OVER SEMICONDUCTOR DIE WITH DIFFERENT CTE INSULATING LAYERS

CLAIM TO DOMESTIC PRIORITY

The present application is a continuation of U.S. patent application Ser. No. 13/164,015, filed Jun. 20, 2011, now U.S. Pat. No. 8,492,203, which claims the benefit of U.S. Provisional Application No. 61/435,215, filed Jan. 21, 2011, which applications are incorporated herein by reference.

FIELD OF THE INVENTION

The present invention relates in general to semiconductor devices and, more particularly, to a semiconductor device and method of forming a semiconductor package having a build-up interconnect structure over a semiconductor die with different CTE insulating layers to create a gradient dielectric across the interconnect structure. The insulating layers are optimized for adhesion to the adjacent layer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A build-up interconnect structure is commonly formed over a semiconductor die for electrical interconnect. The build-up interconnect structure contains one or more insulating layers and one or more conductive layers between the insulating layers. The insulating layers are subject to cracking, particularly during temperature cycling tests, due to coefficient of thermal expansion (CTE) mismatches between adjacent surfaces. The insulating layers often exhibit low tensile strength and elongation with surface wrinkle and weak adhesion to the adjacent layer due to a non-optimal curing profile. The defects in the insulating layers of the build-up interconnect structure lead to lower manufacturing yield and higher cost.

SUMMARY OF THE INVENTION

A need exists for a build-up interconnect structure over a semiconductor die which is robust against cracking and exhibits good adhesion to the adjacent surface. Accordingly, in one embodiment, the present invention is a method of making a semiconductor device comprising the steps of providing a semiconductor die, depositing an encapsulant over the semiconductor die, forming a first insulating layer over the semiconductor die and encapsulant, curing the first insulating layer with multiple dwell cycles, forming a first conductive layer over the first insulating layer, and forming a second insulating layer over the first insulating layer and first conductive layer. A CTE of the second insulating layer is different than a CTE of the first insulating layer.

In another embodiment, the present invention is a method of making a semiconductor device comprising the steps of providing a semiconductor die, forming a first insulating layer over the semiconductor die, curing the first insulating layer with multiple dwell cycles, forming a first conductive layer over the first insulating layer, and forming a second insulating layer over the first insulating layer and first conductive layer.

In another embodiment, the present invention is a semiconductor device comprising a semiconductor die and an encapsulant deposited over the semiconductor die. A first insulating layer is formed over the semiconductor die and encapsulant. A CTE of the first insulating layer is within a first range. A first conductive layer is formed over the first insulating layer. A second insulating layer is formed over the first insulating layer and first conductive layer. A CTE of the second insulating layer is within a second range different from the first range.

In another embodiment, the present invention is a semiconductor device comprising a semiconductor die and a first insulating layer formed over the semiconductor die. A first conductive layer is formed over the first insulating layer. A CTE of the first insulating layer is within a first range. A second insulating layer is formed over the first insulating layer and first conductive layer. A CTE of the second insulating layer is within a second range different from the first range.

BRIEF DESCRIPTION OF THE DRAWINGS

FIGS. 3a-3c illustrate a semiconductor wafer with a plurality of semiconductor die separated by a saw street;

FIGS. 6a-6g illustrate another process of forming an ECWLP package having an interconnect structure over a die with different CTE insulating layers and each insulating layer optimized for adhesion to the adjacent layer; and FIG. 7 illustrates the ECWLP package having an interconnect structure for a semiconductor die with different CTE insulating layers and each insulating layer optimized for adhesion to the adjacent layer.

DETAILED DESCRIPTION OF THE DRAWINGS

Figure 1:
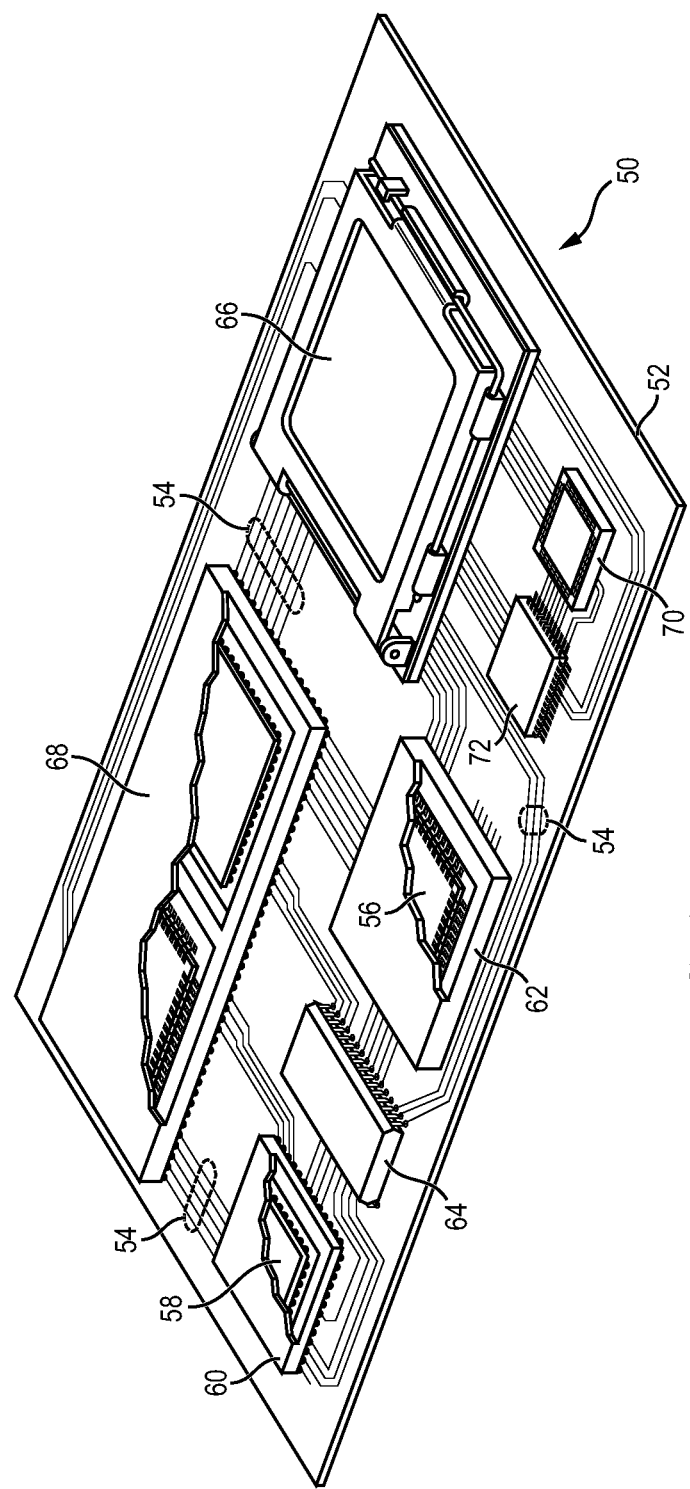
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
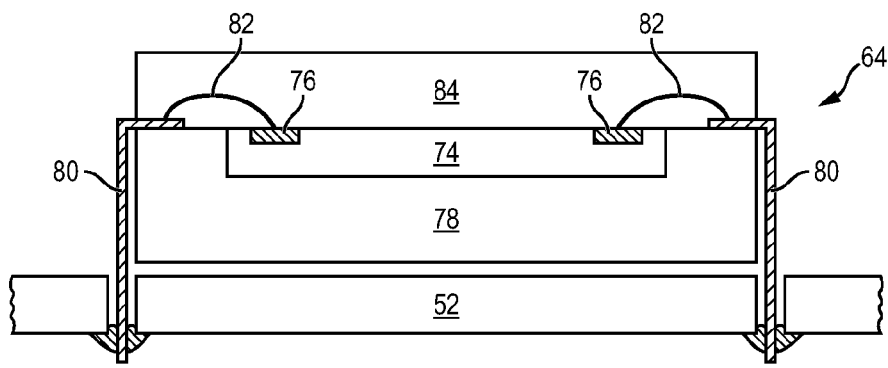
FIGS. 2a-2c illustrate further detail of the representative semiconductor packages mounted to the PCB.
Figure 2B:
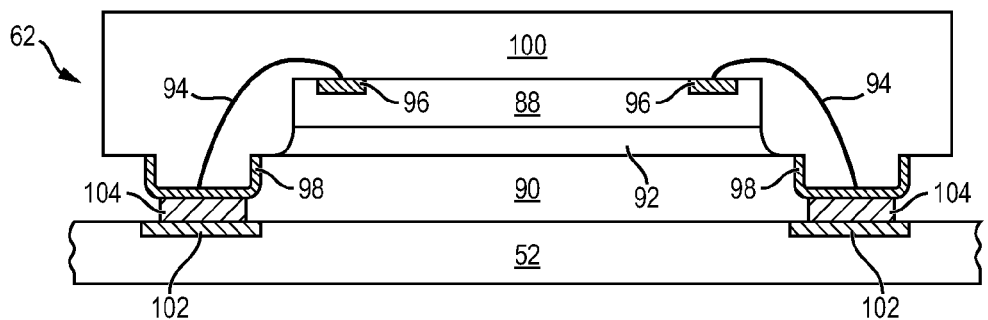
Figure 2C:
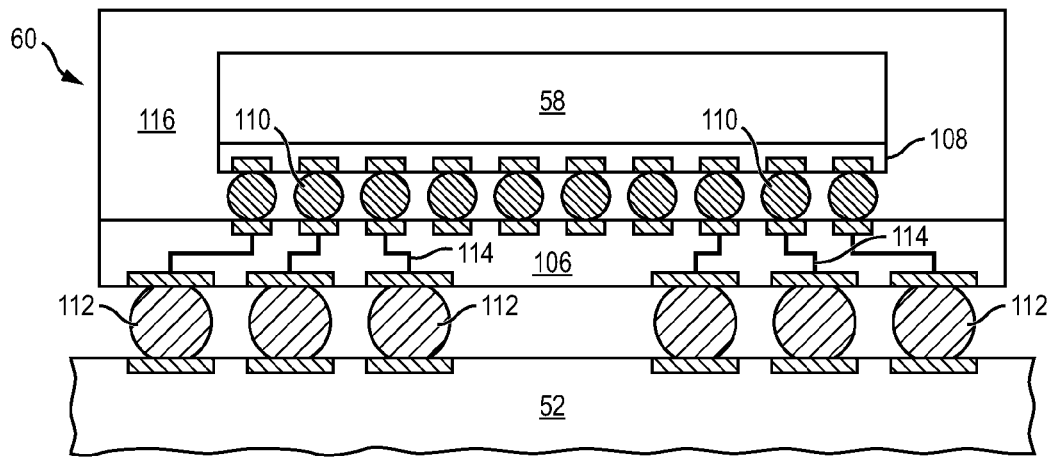

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface region 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active region 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads for the circuits on active surface 130. Contact pads 132 can be disposed side-by-side a first distance from the edge of semiconductor die 124. Alternatively, contact pads 132 can be offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layers 132 for electrical isolation using PVD, CVD, printing, spin coating, spray coating, sintering or thermal oxidation. The insulating layer 134 contains one or more layers of solder resist, silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 134 can be removed by an etching process through a photoresist layer to expose conductive layer 132.

Figure 3C:
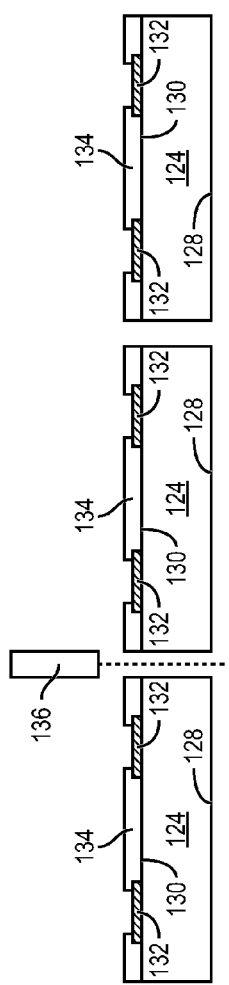

In FIG. 3c, semiconductor wafer 120 is singulated through saw street 126 using a saw blade or laser cutting tool 136 into individual semiconductor die 124.

Figure 4A:
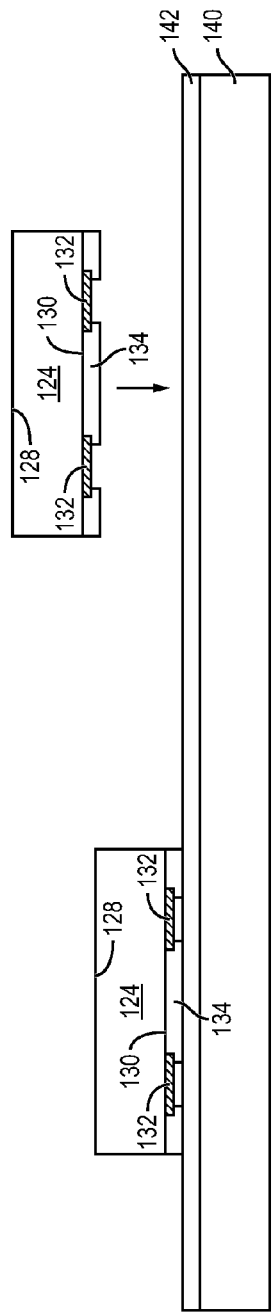
FIGS. 4a-4i illustrate a process of forming an ECWLP package having an interconnect structure over a semiconductor die with different CTE insulating layers and each insulating layer optimized for adhesion to the adjacent layer.

FIGS. 4a-4i illustrate, in relation to FIGS. 1 and 2a-2c, a process of forming an embedded chip wafer level ball grid array (ECWLP) semiconductor package having a build-up interconnect structure over a semiconductor die with different CTE insulating layers and each insulating layer optimized for adhesion to the adjacent layer. FIG. 4a shows a substrate or carrier 140 containing temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

Figure 4B:
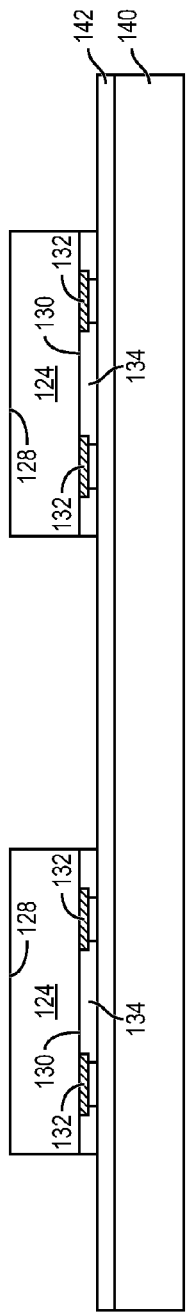

Semiconductor die 124 from FIGS. 3a-3c is aligned with and mounted to carrier 140 with insulating layer 134 oriented toward the carrier. FIG. 4b shows semiconductor die 124 mounted to carrier 140 with insulating layer 134 bonded to interface layer 142.

Figure 4C:
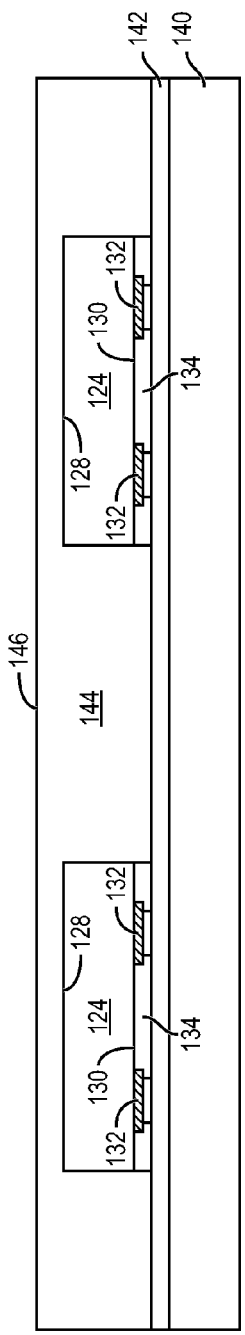

In FIG. 4c, an encapsulant or molding compound 144 is deposited over and around semiconductor die 124 using a paste printing, compressive molding, transfer molding, liquid encapsulant molding, vacuum lamination, spin coating, or other suitable applicator. Encapsulant 144 can be polymer composite material, such as epoxy resin with filler, epoxy acrylate with filler, or polymer with proper filler. Encapsulant 144 is non-conductive and environmentally protects the semiconductor device from external elements and contaminants.

Figure 4D:
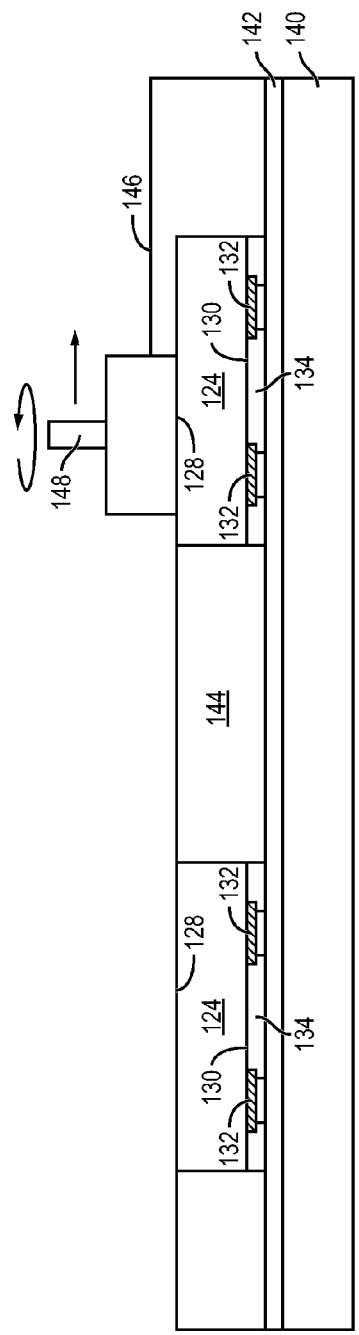

In FIG. 4d, a portion of back surface 146 of encapsulant 144 is removed by grinder 148 in an optional back grinding operation to planarize the encapsulant and expose back surface 128 of semiconductor die 124. The grinding operation reduces the package profile.

Figure 4E:
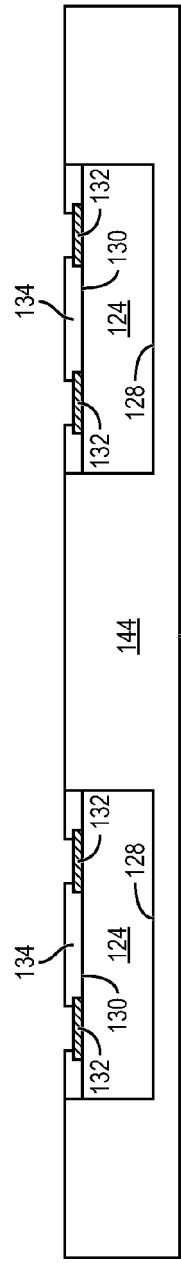

Continuing from FIG. 4c, carrier 140 and interface layer 142 are removed by chemical etching, mechanical peeling, CMP, mechanical grinding, thermal bake, UV light, laser scanning, or wet stripping to expose contact pads 132, insulating layer 134, and encapsulant 144, as shown in FIG. 4e.

Figure 4F:
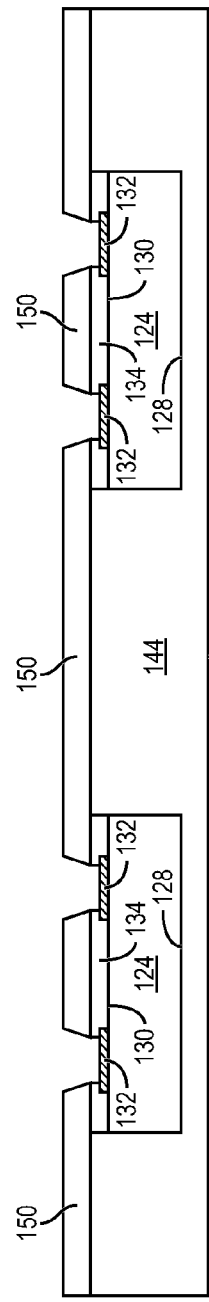

In FIG. 4f, an insulating or dielectric layer 150 is formed over insulating layer 134, encapsulant 144, and the exposed conductive layer 132 using lamination, screen printing, slit coating, spin coating, or spray coating. The insulating layer 150 contains one or more layers of low temperature (less than 250° C.) curing polymer dielectric materials, such as low temperature cure negative tone polyimide (PI), positive tone polybenzoxazoles (PBO), non-photosensitive polymer dielectric with or without filler, or other suitable dielectric material. In particular, insulating layer 150 is patterned and cured for optimal adhesion to conductive layer 132, insulating layer 134, and encapsulant 144 of semiconductor die 124. The curing process for insulating layer 150 involves a multi-step dwell profile, e.g., with at least three different dwell steps, to enhance mechanical and adhesion properties to conductive layer 132, insulating layer 134 and encapsulant 144 under pressure cooker test (PCT), e.g., >400 kg/cm2 for 0 to 200 hours unbiased humidity accelerated stress testing (uHAST), without introducing surface wrinkle after curing. The multi-step dwell profile includes a first dwell step with a temperature less than 100° C., e.g., 70-90° C., for 30-90 minutes to remove solvent and moisture, second dwell step with a temperature between 120-150° C. for 30-60 minutes, and third dwell step with a temperature between 180-240° C. for 60-180 minutes.

The insulating layer 150 has a tensile strength >100 MPa, high elongation >20%, and modulus <3.0 Gpa under 25° C. In particular, a CTE for insulating layer 150 is selected in the range of 30-90 ppm. A portion of insulating layer 150 is removed by an etching process, for example UV exposure followed by wet chemical developing, or laser (UV or excimer laser) via drilling only, to expose conductive layer 132.

Figure 4G:
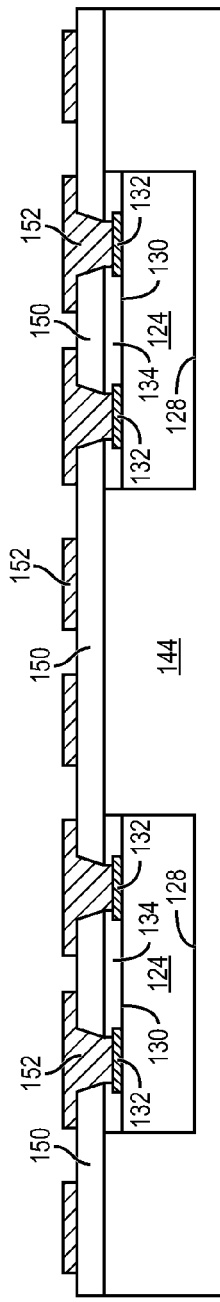

In FIG. 4g, an electrically conductive layer or redistribution layer (RDL) 152 formed over insulating layer 150 and conductive layer 132 using a patterning and metal deposition process such as sputtering, electrolytic plating, and electroless plating. Conductive layer 152 can be one or more layers of Al, Cu, Sn, Ni, Au, Ag, titanium (Ti), tungsten (W), TiW/Cu, Ti/Cu, or other suitable electrically conductive material. One portion of conductive layer 152 is electrically connected to conductive layer 132 of semiconductor die 124. Other portions of conductive layer 152 can be electrically common or electrically isolated depending on the design and function of semiconductor die 124.

Figure 4H:
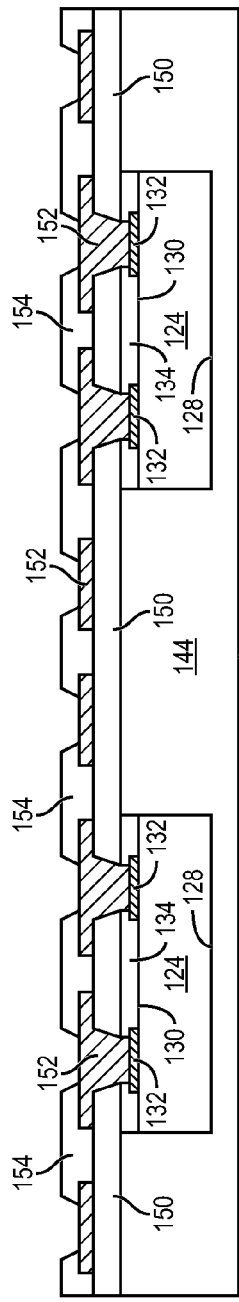

In FIG. 4h, an insulating or dielectric layer 154 is formed over insulating layer 150 and conductive layer 152 using lamination, screen printing, slit coating, spin coating, or spray coating. The insulating layer 154 contains one or more layers of low temperature (less than 250° C.) curing polymer dielectric materials, such as low temperature cure negative tone PI, positive tone PBO, non-photosensitive polymer dielectric with or without filler, or other suitable dielectric material. In particular, insulating layer 154 is patterned and cured for optimal adhesion to insulating layer 150 and conductive layer 152. The curing process for insulating layer 154 involves a multi-step dwell profile, e.g., with at least three different dwell steps, to enhance mechanical and adhesion properties to insulating layer 150 and conductive layer 152 under PCT, e.g., >400 kg/cm2 for 0 to 500 hours uHAST, without introducing surface wrinkle after curing. The multi-step dwell profile includes a first dwell step with a temperature less than 100° C., e.g., 70-90° C., for 30-90 minutes to remove solvent and moisture, second dwell step with a temperature between 120-150° C. for 30-60 minutes, and third dwell step with a temperature between 180-240° C. for 60-180 minutes.

The insulating layer 154 has a tensile strength >100 MPa, high elongation >20%, and modulus <3.0 Gpa under 25° C. In particular, a CTE for insulating layer 154 is selected to be different from the CTE of insulating layer 150. For example, the CTE of insulating layer 154 is selected in the range of 90-150 ppm. Alternatively, the CTE of insulating layer 150 is selected to be 90-150 ppm and the CTE of insulating layer 154 is selected to be 30-90 ppm. In one embodiment, the CTE of insulating layer 150 is selected to be 73 ppm, and the CTE of insulating layer 154 is selected to be 126 ppm. A portion of insulating layer 154 is removed by an etching process, for example UV exposure followed by wet chemical developing, or laser (UV or excimer laser) via drilling only, to expose conductive layer 152.

The different CTEs of insulating layers 150 and 154 create a dielectric gradient across interconnect structure 158. The dielectric gradient reduces stress induced by insulating layers 150 and 154 during temperature cycling, e.g., during reliability testing, especially due to the free boundary surface of insulating layer 154 and CTE mismatch between insulating layer 150 and encapsulant 144 and semiconductor die 124.

In another embodiment, insulating layers 150 and 154 have similar CTE, e.g., +/−30 ppm/° C. The insulating layer 150 has good adhesion to conductive layer 132, insulating layer 134, and encapsulant 144 during the build-up process and after curing, as well as good mechanical properties of tensile strength >100 MPa and high elongation >20%. The insulating layer 154 has good adhesion to insulating layer 150 and conductive layer 152, as well as good mechanical properties of tensile strength >100 MPa and high elongation (>20%). In addition, insulating layer 154 has a dense material structure to block or delay the moisture penetration into the film, and therefore into insulating layer 150, 150/144 interface, and 150/134 interface. The dense state of insulating layer 154 also improves reliability in uHAST and PCT and prevents interface delamination at the 150/144 interface and 150/134 interface.

In another embodiment, insulating layers 150 and 154 have good adhesion to conductive layer 132, insulating layer 134, and encapsulant 144, as well as good mechanical properties of tensile strength >100 MPa and high elongation >20%. The insulating layer 150 is cured at higher temperature for example, 240° C.+/−10° C., while insulating layer 154 is cured at lower temperature, e.g., 215° C.+/−10° C. The different curing temperatures lower contact resistance between conductive layers 132 and 152, and package temperature cycling test reliability performance due to different residue stress, warpage behavior, out-gassing control in the seed layer PVD for conductive layer 152, and enhance interface between 150 and 154 under different temperatures.

Figure 4I:
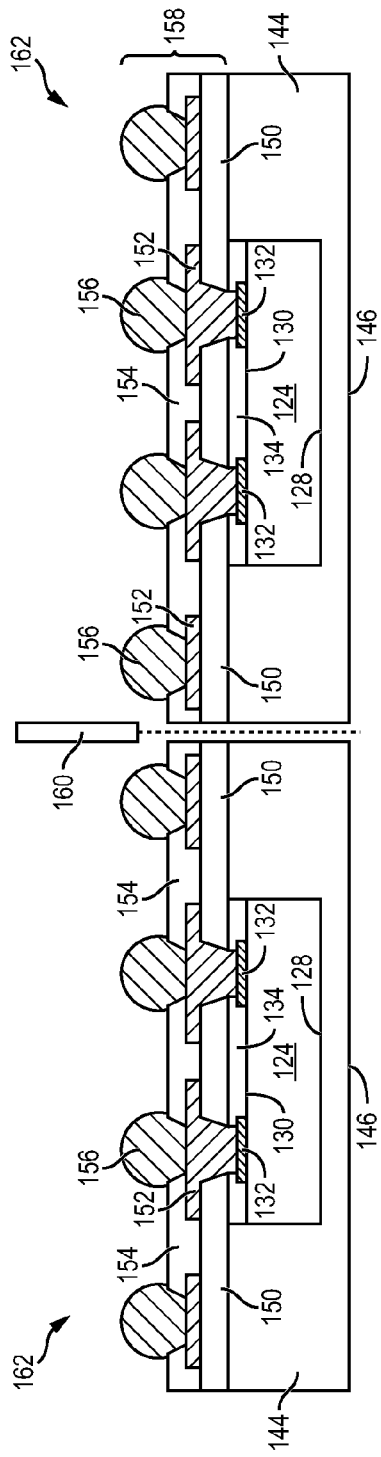

In FIG. 4i, an electrically conductive bump material is deposited over conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form balls or bumps 156. In some applications, bumps 156 are reflowed a second time to improve electrical contact to conductive layer 152. Bumps 156 can also be compression bonded to conductive layer 152. Bumps 156 represent one type of interconnect structure that can be formed over conductive layer 152. The interconnect structure can also use stud bump, micro bump, or other electrical interconnect.

The insulating layers 150 and 154, conductive layer 152, and bumps 156 constitute a build-up interconnect structure 158 formed over active surface 130 of semiconductor die 124 and encapsulant 144. Semiconductor die 124 and build-up interconnect structure 158 represent an ECWLP in a reconstituted wafer form. The reconstituted wafer is singulated through build-up interconnect structure 158 and encapsulant 144 using a saw blade or laser cutting tool 160 into individual ECWLP packages 162 containing semiconductor die 124.

Figure 5:
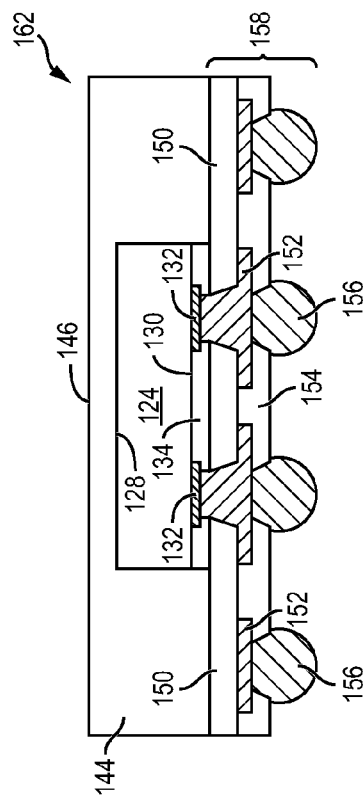
FIG. 5 illustrates the ECWLP package having an interconnect structure for a semiconductor die with different CTE insulating layers and each insulating layer optimized for adhesion to the adjacent layer.

FIG. 5 shows ECWLP package 162 with semiconductor die 124 electrically connected to conductive layer 152 and bumps 156 for external interconnect to other semiconductor devices. In one embodiment, the CTE of insulating layer 150 is selected in the range of 30-90 ppm, and the CTE of insulating layer 154 is selected in the range of 90-150 ppm. Alternatively, the CTE of insulating layer 150 is selected to be 90-150 ppm and the CTE of insulating layer 154 is selected to be 30-90 ppm. The different CTEs of insulating layers 150 and 154 create a dielectric gradient across interconnect structure 158. The dielectric gradient reduces stress induced by insulating layers 150 and 154 during temperature cycling, e.g., during reliability testing, especially due to the free boundary surface of insulating layer 154 and CTE mismatch between insulating layer 150 and encapsulant 144 and semiconductor die 124.

The insulating layer 150 is patterned and cured for optimal adhesion to conductive layer 132, insulating layer 134 and encapsulant 144 of semiconductor die 124. The curing process for insulating layer 150 involves a multi-step dwell profile to enhance mechanical and adhesion properties to conductive layer 132, insulating layer 134, and encapsulant 144, without introducing surface wrinkle. The insulating layer 154 is patterned and cured for optimal adhesion to insulating layer 150 and conductive layer 152. The curing process for insulating layer 154 involves a multi-step dwell profile to enhance mechanical and adhesion properties to insulating layer 150 and conductive layer 152, without introducing surface wrinkle.

FIGS. 6a-6g illustrate, in relation to FIGS. 1 and 2a-2c, another process of forming an ECWLP semiconductor package having a build-up interconnect structure over a semiconductor die with different CTE insulating layers and each insulating layer optimized for adhesion to the adjacent layer. Continuing from FIG. 4e, an insulating or dielectric layer 170 is formed over insulating layer 134, encapsulant 144, and the exposed conductive layer 132 using lamination, screen printing, slit coating, spin coating, or spray coating. The insulating layer 170 contains one or more layers of low temperature (less than 250° C.) curing polymer dielectric materials, such as low temperature cure negative tone PI, positive tone PBO, non-photosensitive polymer dielectric with or without filler, or other suitable dielectric material. In particular, insulating layer 170 is patterned and cured for optimal adhesion to conductive layer 132, insulating layer 134, and encapsulant 144 of semiconductor die 124. The curing process for insulating layer 170 involves a multi-step dwell profile, e.g., with at least three different dwell steps, to enhance mechanical and adhesion properties to conductive layer 132, insulating layer 134 and encapsulant 144 under PCT, e.g., >400 kg/cm2 for 0 to 200 hours uHAST, without introducing surface wrinkle after curing. The multi-step dwell profile includes a first dwell step with a temperature less than 100° C., e.g., 70-90° C., for 30-90 minutes to remove solvent and moisture, second dwell step with a temperature between 120-150° C. for 30-60 minutes, and third dwell step with a temperature between 180-240° C. for 60-180 minutes. The insulating layer 170 has a tensile strength >100 MPa, elongation >20%, and modulus <3.0 Gpa under 25° C. In particular, a CTE for insulating layer 170 is selected in the range of 30-90 ppm. A portion of insulating layer 170 is removed by an etching process, for example UV exposure followed by wet chemical developing, or laser (UV or excimer laser) via drilling only, to expose conductive layer 132.

Figure 6A:
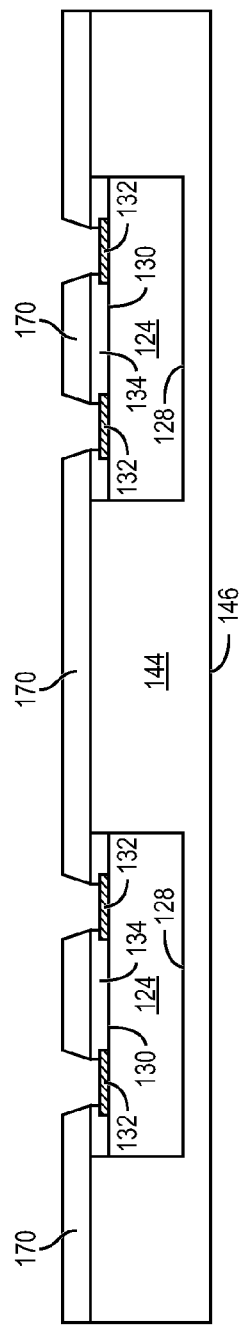
Figure 6B:
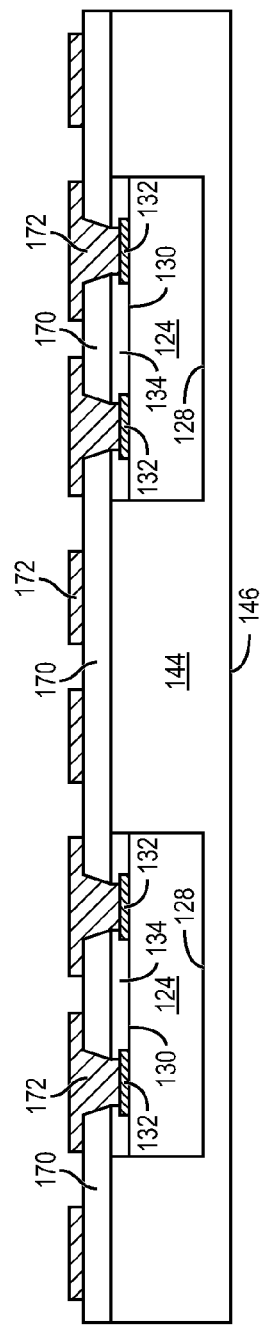

In FIG. 6b, an electrically conductive layer or RDL 172 formed over insulating layer 170 and conductive layer 132 using a patterning and metal deposition process such as sputtering, electrolytic plating, and electroless plating. Conductive layer 172 can be one or more layers of Al, Cu, Sn, Ni, Au, Ag, Ti, W, TiW/Cu, Ti/Cu, or other suitable electrically conductive material. One portion of conductive layer 172 is electrically connected to conductive layer 132 of semiconductor die 124. Other portions of conductive layer 172 can be electrically common or electrically isolated depending on the design and function of semiconductor die 124.

Figure 6C:
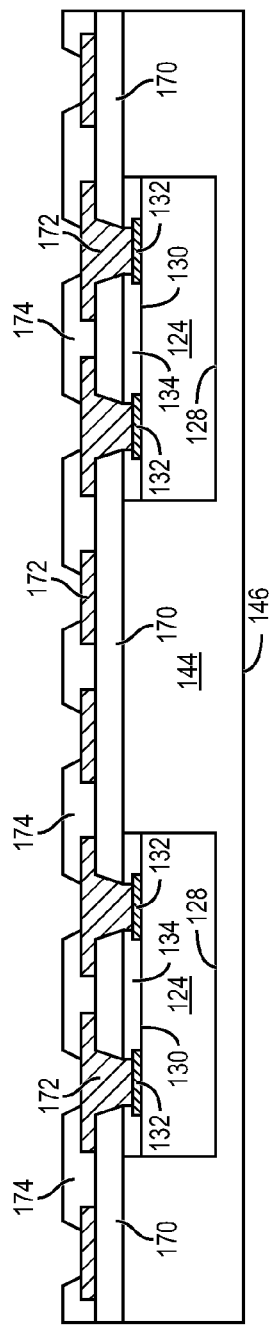

In FIG. 6c, an insulating or dielectric layer 174 is formed over insulating layer 170 and conductive layer 172 using lamination, screen printing, slit coating, spin coating, or spray coating. The insulating layer 174 contains one or more layers of low temperature (less than 250° C.) curing polymer dielectric materials, such as low temperature cure negative tone PI, positive tone PBO, non-photosensitive polymer dielectric with or without filler, or other suitable dielectric material. In particular, insulating layer 174 is patterned and cured for optimal adhesion to insulating layer 170 and conductive layer 172. The curing process for insulating layer 174 involves a multi-step dwell profile, e.g., with at least three different dwell steps, to enhance mechanical and adhesion properties to insulating layer 170 and conductive layer 172 under PCT, e.g., >400 kg/cm2 for 0 to 500 hours uHAST, without introducing surface wrinkle after curing. The multi-step dwell profile includes a first dwell step with a temperature less than 100° C., e.g., 70-90° C., for 30-90 minutes to remove solvent and moisture, second dwell step with a temperature between 120-150° C. for 30-60 minutes, and third dwell step with a temperature between 180-240° C. for 60-180 minutes.

The insulating layer 174 has a tensile strength >100 MPa, elongation >20%, and modulus <3.0 Gpa under 25° C. In particular, a CTE for insulating layer 174 is selected to be different from the CTE of insulating layer 170. For example, the CTE of insulating layer 174 is selected in the range of 90-110 ppm. Alternatively, the CTE of insulating layer 170 is selected to be 90-110 ppm and the CTE of insulating layer 174 is selected to be 30-90 ppm. In one embodiment, the CTE of insulating layer 170 is selected to be 73 ppm, and the CTE of insulating layer 174 is selected to be 106 ppm. A portion of insulating layer 174 is removed by an etching process, for example UV exposure followed by wet chemical developing, or laser (UV or excimer laser) via drilling only, to expose conductive layer 172.

Alternatively, insulating layer 174 has a dense structure after the multi-step dwell curing profile to block or delay the moisture penetration into the film, and therefore into insulating layer 170, 170/144 interface, and 170/134 interface.

Figure 6D:
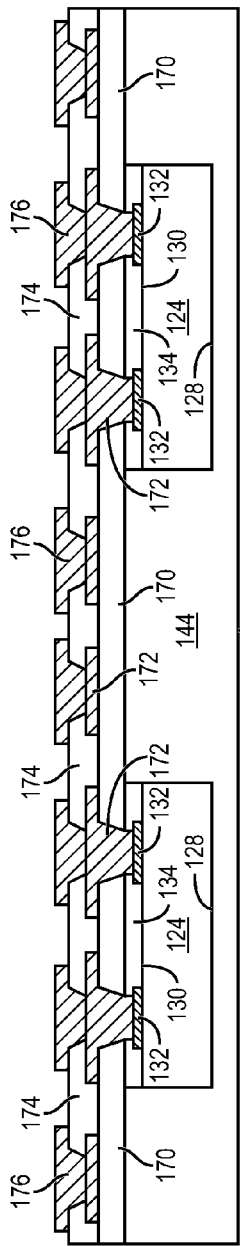

In FIG. 6d, an electrically conductive layer or RDL 176 formed over insulating layer 174 and conductive layer 172 using a patterning and metal deposition process such as sputtering, electrolytic plating, and electroless plating. Conductive layer 176 can be one or more layers of Al, Cu, Sn, Ni, Au, Ag, Ti, W, TiW/Cu, Ti/Cu, or other suitable electrically conductive material. One portion of conductive layer 176 is electrically connected to conductive layer 172. Other portions of conductive layer 176 can be electrically common or electrically isolated depending on the design and function of semiconductor die 124.

Figure 6E:
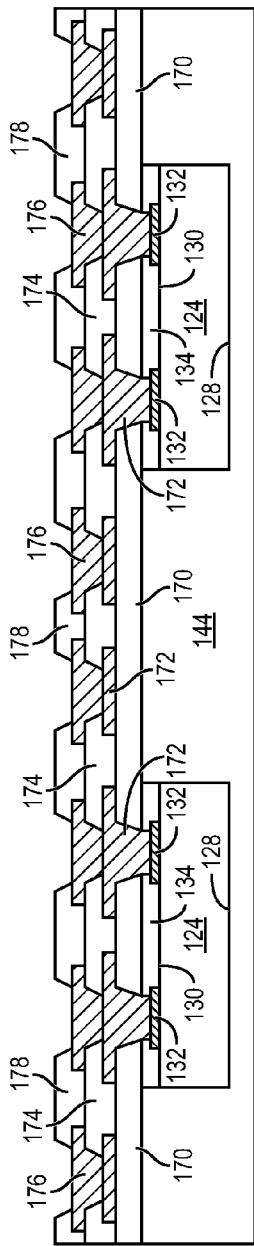

In FIG. 6e, an insulating or dielectric layer 178 is formed over insulating layer 174 and conductive layer 176 using lamination, screen printing, slit coating, spin coating, or spray coating. The insulating layer 178 contains one or more layers of low temperature (less than 250° C.) curing polymer dielectric materials, such as low temperature cure negative tone PI, positive tone PBO, non-photosensitive polymer dielectric with or without filler, or other suitable dielectric material. In particular, insulating layer 178 is patterned and cured for optimal adhesion to insulating layer 174 and conductive layer 176. The curing process for insulating layer 178 involves a multi-step dwell profile, e.g., with at least three different dwell steps, to enhance mechanical and adhesion properties to insulating layer 174 and conductive layer 176 under PCT, e.g., >400 kg/cm2 for 0 to 500 hours uHAST, without introducing surface wrinkle after curing. The multi-step dwell profile includes a first dwell step with a temperature less than 100° C., e.g., 70-90° C., for 30-90 minutes to remove solvent and moisture, second dwell step with a temperature between 120-150° C. for 30-60 minutes, and third dwell step with a temperature between 180-240° C. for 60-180 minutes.

The insulating layer 178 has a tensile strength >100 MPa, elongation >20%, and modulus <3.0 Gpa under 25° C. In particular, a CTE for insulating layer 178 is selected to be different from the CTE of insulating layers 170 and 174. For example, the CTE of insulating layer 178 is selected in the range of 110-150 ppm. Alternatively, the CTE of insulating layer 170 is selected to be 110-150 ppm, the CTE of insulating layer 174 is selected to be 90-110 ppm, and the CTE of insulating layer 178 is selected to be 30-90 ppm. In one embodiment, the CTE of insulating layer 170 is selected to be 73 ppm, the CTE of insulating layer 174 is selected to be 106 ppm, and the CTE of insulating layer 178 is selected to be 126 ppm. A portion of insulating layer 178 is removed by an etching process, for example UV exposure followed by wet chemical developing, or laser (UV or excimer laser) via drilling only, to expose conductive layer 176.

Alternatively, insulating layer 178 has a dense structure after the multi-step dwell curing profile to block or delay the moisture penetration into the film, and therefore into insulating layer 178 and 178/174 interface.

The different CTEs of insulating layers 170, 174, and 178 create a dielectric gradient across interconnect structure 182. The dielectric gradient reduces stress induced by insulating layers 170, 174, and 178 during temperature cycling.

Figure 6F:
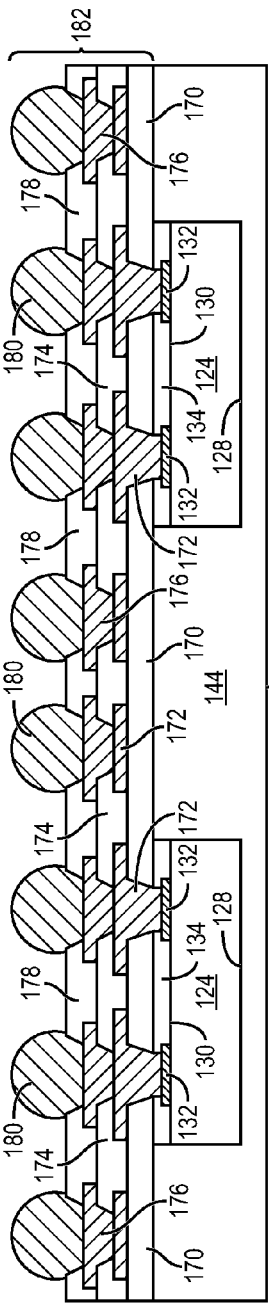

In FIG. 6f, an electrically conductive bump material is deposited over conductive layer 176 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 176 using a suitable attachment or bonding process. In one embodiment, the bump material is reflowed by heating the material above its melting point to form balls or bumps 180. In some applications, bumps 180 are reflowed a second time to improve electrical contact to conductive layer 176. Bumps 180 can also be compression bonded to conductive layer 176. Bumps 180 represent one type of interconnect structure that can be formed over conductive layer 176. The interconnect structure can also use stud bump, micro bump, or other electrical interconnect.

The insulating layers 170, 174, and 178, conductive layer 172 and 176, and bumps 180 constitute a build-up interconnect structure 182 formed over active surface 130 of semiconductor die 124 and encapsulant 144. Semiconductor die 124 and build-up interconnect structure 182 represent an ECWLP in a reconstituted wafer form. The reconstituted wafer is singulated through build-up interconnect structure 182 and encapsulant 144 using a saw blade or laser cutting tool 183 into individual ECWLP packages 184 containing semiconductor die 124.

FIG. 7 shows ECWLP package 184 with semiconductor die 124 electrically connected to conductive layers 172 and 176 and bumps 180 for external interconnect to other semiconductor devices. The different CTEs of insulating layers 170, 174, and 178 create a dielectric gradient across interconnect structure 182. The dielectric gradient reduces stress induced by insulating layers 170, 174, and 178 during temperature cycling.

The insulating layer 170 is patterned and cured for optimal adhesion to conductive layer 132, insulating layer 134 and encapsulant 144 of semiconductor die 124. The curing process for insulating layer 170 involves a multi-step dwell profile to enhance mechanical and adhesion properties to conductive layer 132, insulating layer 134, and encapsulant 144, without introducing surface wrinkle. The insulating layer 174 is patterned and cured for optimal adhesion to insulating layer 170 and conductive layer 172. The insulating layer 178 has a tensile strength >100 MPa, elongation >20%, and modulus <3.0 Gpa under 25° C.

Alternatively, insulating layer 170 has a tensile strength >100 MPa, elongation >20%, and modulus <3.0 Gpa under 25° C. The insulating layer 178 has a dense structure after the multi-step dwell curing profile to block moisture in the PCT. The insulating layer 174 can have properties of either insulating layer 170 or insulating layer 178.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a plurality of semiconductor die in a reconstituted wafer;
   depositing an encapsulant over the plurality of semiconductor die;
   forming a first insulating layer over the plurality of semiconductor die and directly on the encapsulant;
   curing the first insulating layer with multiple dwell cycles;
   forming a first conductive layer over the first insulating layer; and
   forming a second insulating layer directly on the first insulating layer and the first conductive layer, wherein a coefficient of thermal expansion (CTE) of the second insulating layer is different from a CTE of the first insulating layer.

2. The method of claim 1, further including forming a second conductive layer over the second insulating layer and the first conductive layer.

3. The method of claim 1, further including curing the second insulating layer with multiple dwell cycles.

4. The method of claim 1, wherein curing with multiple dwell cycles further includes:
   dwelling at a first temperature for a first time period;
   dwelling at a second temperature for a second time period; and
   dwelling at a third temperature for a third time period.

5. The method of claim 4, wherein the first temperature is less than 100° C.

6. The method of claim 1, further including forming a third insulating layer over the second insulating layer, wherein a CTE of the third insulating layer is different from the CTE of the first and second insulating layers.

7. The method of claim 6, wherein the CTE of the first insulating layer, the CTE of the second insulating layer, and the CTE of the third insulating layer form a dielectric gradient increasing from the first insulating layer to the third insulating layer.

8. The method of claim 1, further including singulating the reconstituted wafer through the encapsulant and the first and second insulating layers.

9. The method of claim 1, wherein the CTE of the second insulating layer is greater than the CTE of the first insulating layer.

10. The method of claim 1, wherein the CTE of the first insulating layer and the CTE of the second insulating layer form a dielectric gradient increasing from the first insulating layer to the second insulating layer.

11. A method of making a semiconductor device, comprising:
   providing a semiconductor die;
   forming a first insulating layer over the semiconductor die, wherein a coefficient of thermal expansion (CTE) of the first insulating layer is within a first range;
   forming a first conductive layer over the first insulating layer; and
   forming a second insulating layer over the first insulating layer and the first conductive layer, wherein a CTE of the second insulating layer is within a second range different from the first range and the CTE of the first insulating layer and the CTE of the second insulating layer form a dielectric gradient increasing from the first insulating layer to the second insulating layer.

12. The method of claim 11, further including curing the first insulating layer with multiple dwell cycles.

13. The method of claim 12, wherein curing with multiple dwell cycles further includes:
dwelling at a first temperature for a first time period;
dwelling at a second temperature for a second time period; and
dwelling at a third temperature for a third time period.

14. The method of claim 11, wherein the second range is less than the first range.

15. The method of claim 11, further including forming a third insulating layer over the second insulating layer, wherein a CTE of the third insulating layer is within a third range which is different from the first and second ranges.

16. A method of making a semiconductor device, comprising:
providing a semiconductor die;
depositing an encapsulant over the semiconductor die;
forming a first insulating layer including a first coefficient of thermal expansion (CTE) over the semiconductor die and directly on the encapsulant;
curing the first insulating layer with multiple dwell cycles;
forming a first conductive layer over the first insulating layer; and
forming a second insulating layer including a second CTE over the first insulating layer and the first conductive layer, wherein the first CTE and second CTE form a dielectric gradient increasing from the first insulating layer to the second insulating layer.

17. A method of making a semiconductor device, comprising:
providing a semiconductor die;
depositing an encapsulant over the semiconductor die;
forming a first insulating layer including a first coefficient of thermal expansion (CTE) over the semiconductor die and directly on the encapsulant;
curing the first insulating layer with multiple dwell cycles;
forming a first conductive layer over the first insulating layer;
forming a second insulating layer including a second CTE over the first insulating layer and the first conductive layer; and
forming a third insulating layer over the second insulating layer, wherein the third insulating layer includes a third CTE different from the first or second CTE and the first CTE, second CTE, and third CTE form a dielectric gradient increasing from the first insulating layer to the third insulating layer.

* * * * *